United States Patent
Hayhow (10) Patent No.: US 7,321,967 B2
(45) Date of Patent: Jan. 22, 2008

(54) SYSTEM AND METHOD FOR CONFIGURING CAPABILITIES OF PRINTED CIRCUIT BOARDS

(75) Inventor: Reid Hayhow, LaPorte, CO (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 1188 days.

(21) Appl. No.: 10/423,253

(22) Filed: Apr. 25, 2003

(65) Prior Publication Data

US 2004/0212634 A1 Oct. 28, 2004

(51) Int. Cl.
G06F 1/24 (2006.01)
(52) U.S. Cl. .......................................... 713/100; 713/1
(58) Field of Classification Search ................ 713/100, 713/1
See application file for complete search history.

(56) References Cited

U.S. PATENT DOCUMENTS 6,259,448 B1 * 7/2001 McNally et al. ............ 715/733
7,082,521 B1 * 7/2006 Nanja ............................ 713/1
2003/0196126 A1 * 10/2003 Fung .......................... 713/300

* cited by examiner

Primary Examiner—Thuan Du (57) ABSTRACT

Methods for configuring the capabilities of electronic systems containing printed circuit boards are provided. One such method comprises: providing an initial configuration describing a first set of capabilities corresponding to each PCB as currently configured; modifying the initial configuration through a user interface to produce a new configuration describing a second set of capabilities corresponding to each PCB after upgrade; saving the initial configuration as modified by the user interface to be the new configuration; and configuring the plurality of PCBs according to the new configuration. Systems are also provided.

19 Claims, 10 Drawing Sheets

SYSTEM AND METHOD FOR CONFIGURING CAPABILITIES OF PRINTED CIRCUIT BOARDS

BACKGROUND

Many different types of electronic systems contain printed circuit boards, which can be upgraded or reconfigured to some degree without any hardware modification. Such an upgrade or reconfiguration often requires the use of a configuration file. A configuration file identifies the printed circuit board(s) and/or modules(s) on the board to be upgraded or reconfigured, and also describes the capabilities that the board(s) and/or modules(s) should have after the upgrade or reconfiguration. Typically, a configuration file is a text file that the technician or system operator edits with a standard editor, according to detailed instructions from the board's manufacturer. However, manual editing of a configuration file is prone to error.

A configuration file can also be created through a configuration program that uses a graphical user interface to display a representation of the printed circuit boards on the screen. This requires the system operator or technician using such a program to associate a particular printed circuit board with its representation on the screen. Printed circuit boards are sometimes identified by numbering or labeling, and in such cases, the program may use these numbers or labels on the screen. However, the technician or system operator may not readily recall the numbering or labeling scheme. Therefore, a need exists for a system or method to address the above deficiencies in identifying a printed circuit board during an upgrade or reconfiguration.

SUMMARY

Systems and methods for configuring the capabilities of electronic systems containing printed circuit boards are provided. One such method comprises: providing an initial configuration describing a first set of capabilities corresponding to each PCB as currently configured; modifying the initial configuration through a user interface to produce a new configuration describing a second set of capabilities corresponding to each PCB after upgrade; saving the initial configuration as modified by the user interface to be the new configuration; and configuring the plurality of PCBs according to the new configuration.

A system for configuring the capabilities of electronics systems containing printed circuit boards comprises a memory to store one or more programs, where programs comprise executable instructions, and a processor, in communication with the memory through a local interface, for executing instructions from the one or more programs stored in memory. The system also comprises a display in communication with the processor through the local interface, which is used by the one or more programs as an output device, and an input device in communication with the processor through the local interface, which is used by the one or more programs to obtain user input. The system also comprises logic configured to: provide an initial configuration describing a first set of capabilities corresponding to each PCB as currently configured; modify the initial configuration through a user interface to produce a new configuration describing a second set of capabilities corresponding to each PCB after upgrade; save the initial configuration as modified by the user interface to be the new configuration; and configure the plurality of PCBs according to the new configuration.

BRIEF DESCRIPTION OF THE DRAWINGS

The invention can be better understood with reference to the following drawings. The components in the drawings are not necessarily to scale relative to each other. Instead, emphasis is placed upon clearly illustrating the principles of the present invention. Moreover, in the drawings, like reference numerals designate corresponding parts throughout the figures.

DETAILED DESCRIPTION

As will be described in detail here, systems and methods are provided that identify printed circuit boards, or boards, during configuration or upgrade of an electronic system containing those boards. A configuration program is used to create a new configuration. In some embodiments, the user interface of the configuration program shows, on-screen, a representation of the boards, and the on-screen representation corresponds to the physical arrangement of the boards in a cabinet. This on-screen arrangement allows the user to select which boards are to be configured, and to specify a new configuration for the set of boards. In other embodiments, the on-screen representation corresponds to a logical arrangement of the boards in a distribution frame rather than the physical arrangement of the boards in a cabinet.

Figure 1:
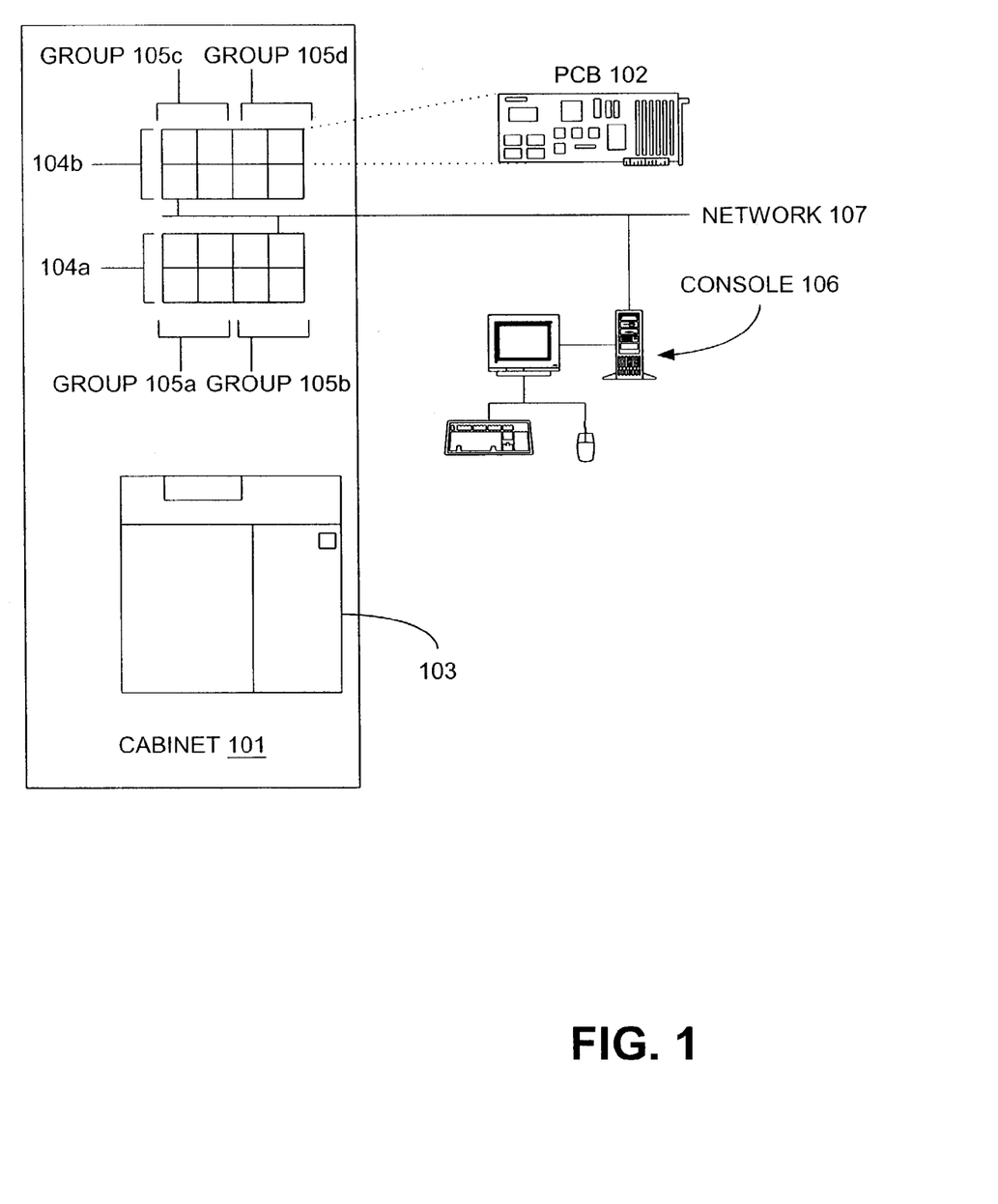
FIG. 1 is a diagram of the environment of an electronic system, containing printed circuit boards, in which an embodiment of a system for configuring the capabilities of printed circuit boards can be used.

Referring now to the drawings, FIG. 1 is a diagram of the environment of an electronic system, containing printed circuit boards, in which an embodiment of a system for configuring the capabilities of printed circuit boards can be used. A cabinet 101 houses a plurality of printed circuit boards (PCBs) or boards 102, with at least one backplane (not shown) electrically connecting signals between the boards 102. In this example embodiment, the cabinet also contains other equipment 103 such as a power supply. However, the other equipment is not required in all embodiments. Although the particular functionality of the boards 102 may vary among embodiments, boards 102 could include, for example, line cards in a telecommunications system, or channel cards in an automated test equipment (ATE) system.

The particular arrangement of boards 102 within the cabinet 101 is called the physical layout. In FIG. 1, the physical layout comprises two rows 104a-b. Each row 104 contains four stacks of boards, with each stack containing two boards. Thus, each row 104 has eight boards, for a total of 16 boards in cabinet 101. The rows, stacks, and/or individual boards 102 may be numbered or labeled. Additionally or alternatively, boards 102 may be grouped by function, and these groups may also be numbered or labeled. In FIG. 1, there are four groups 105a-d.

Each board 102 has a set of capabilities that can be reconfigured without a change to the board hardware. For example, the line card may have two configurable capabilities: line speed and protocol. As another example, the configurable capabilities of a channel card might be clock speed and memory. The set of all capabilities for all boards 102 is referred to as a configuration. Altering the configuration might be as simple as sending one or more commands to a board 102, or might involve a more complicated procedure such as downloading new firmware to a board 102.

An operator creates a new configuration by executing a configuration program on console 106. This new configuration describes the capabilities of boards 102 as they will be after the reconfiguration is complete. The program allows the operator to start with an initial configuration that describes the current capabilities of boards 102, and enables the operator to then modify one or more capabilities of one or more boards 102. After modifying, the operator saves the modified configuration as a new configuration. The program then typically verifies that the new configuration is suitable, and provides warning and/or error messages if not.

In one embodiment, console 106 is in communication with boards 102 through a network 107. This allows console 106 to create a new configuration and to perform the reconfiguration. In another embodiment, creating a new configuration and performing the reconfiguration are done on different systems. For example, the program executing on console 106 could save the new configuration to a file or database on network 107. Then a different reconfiguration program could read the new configuration from the file or database and communicate with boards 102 to perform the reconfiguration.

Figure 2:
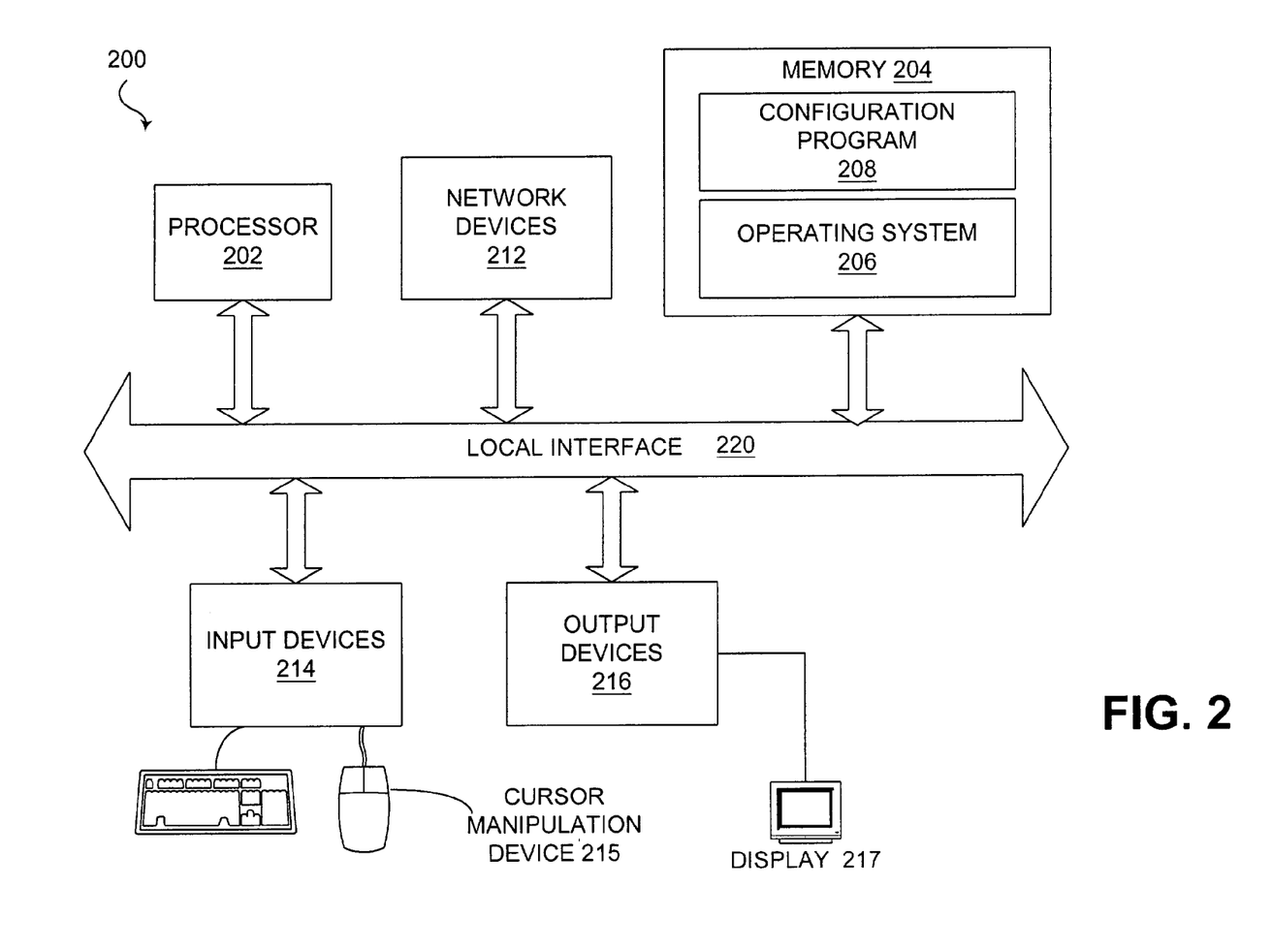
FIG. 2 is a block diagram illustrating an embodiment of a computing system that may be used to implement a method for configuring capabilities of printed circuit boards.

The configuration program may be implemented in software, firmware, hardware, or combinations thereof. In the embodiment illustrated in FIG. 2, configuration program 208 is implemented in software, as an executable program, which is executed by a processing device 202. Generally, in terms of hardware architecture, as shown in FIG. 2, system 200 comprises a processing device 202, memory 204, one or more network interface devices 212, and one or more input devices 214 and one or more output devices 216, all interconnected via a local interface 220. System 200 may further comprise additional components not illustrated in FIG. 2.

Referring again to FIG. 2, the various components of system 200 will be described. Local interface 220 may be, for example but not limited to, one or more buses or other wired or wireless connections. The local interface 220 may have additional elements, which are omitted for simplicity, such as controllers, buffers (caches), drivers, repeaters, and receivers, to enable communications. Furthermore, the local interface 220 may include address, control, and/or data connections to enable appropriate communications among the aforementioned components.

Processing device 202 is a hardware device for executing software, particularly that stored in memory 204. Processing device 202 may be, for example, any central processing unit (CPU), an auxiliary processor among several processors associated with system 200, a microprocessor (in the form of one chip or a chip set), or a macroprocessor.

As illustrated in FIG. 2, memory 204 may comprise an operating system 206 and configuration program 208. The architecture, operation, and/or functionality of configuration program 208 will be described in detail below. Memory 204 may include any one or combination of volatile memory elements (e.g., random access memory (RAM, such as DRAM, SRAM, SDRAM, etc.)) and nonvolatile memory elements (e.g., ROM, hard drive, tape, CDROM, etc.). Memory 204 may incorporate electronic, magnetic, optical, and/or other types of storage media. Furthermore, memory 204 may have a distributed architecture, in which various components are situated remote from one another, but can be accessed by processing device 202.

The software in memory 204 may include one or more separate programs, each of which comprises executable instructions for implementing logical functions. In the example of FIG. 2, the software in memory 204 includes configuration program 208 according to the present invention. Memory 204 may further comprise a suitable operating system 206 that controls the execution of other computer programs, such as configuration program 208, and provides scheduling, input/output control, file and data management, memory management, and communication control and related services.

During operation of system 200, the processing device 202 is configured to execute logic stored within the memory 204, to communicate data to and from the memory 204, and to generally control operations of the system 200 pursuant to the software. Configuration program 208 and operating system 206, in whole or in part, but typically the latter, are read by the processing device 202, perhaps buffered within the processing device 202, and then executed.

Configuration program 208 may be a source program, executable program (object code), script, or any other entity comprising a set of instructions to be performed. When implemented as a source program, then the program needs to be translated via a compiler, assembler, interpreter, or the like, which may or may not be included within the memory 204, so as to operate properly in connection with operating system 206. Furthermore, configuration program 208 may be written as (a) an object oriented programming language, which has classes of data and methods, or (b) a procedure programming language, which has routines, subroutines, and/or functions, for example but not limited to, C, C++, Pascal, Basic, Fortran, Cobol, Perl, Java, and Ada.

Network interface device(s) 212 may be any device configured to facilitate communication between system 200 and a communication network, such as: a public or private packet-switched or other data network, including the Internet; a circuit switched network, such as the public switched telephone network; a local area network, including wired and wireless networks; an optical network; or any other desired communications infrastructure.

In one embodiment, input devices 214 include a cursor manipulation device 215 and output devices 216 include a display device 217. In this embodiment, configuration program 208 is configured to enable a user to select objects in a graphical display portion of a graphical user interface via cursor manipulation device 215 and display device 217.

One of ordinary skill in the art will appreciate that display device 217 may comprise any of the following (or other) types of devices configured to support the graphical user interface: a computer monitor; a touch-sensitive screen, such as those implemented in portable computing devices (e.g., a personal digital assistant (PDA)); and any other known or future display device, regardless of the underlying display technology. Furthermore, cursor manipulation device 215 may comprise any input device configured to cooperate with operating system 206 and/or configuration program 208 to manipulate a cursor displayed on the display device 217. For example, cursor manipulation device 215 may comprise a mouse, a trackball, a set of navigation keys (e.g., arrow keys), and a joystick, to name a few.

In embodiments where configuration program 208 is implemented in software, as is shown in FIG. 2, configuration program 208 may be stored on any computer-readable medium for use by or in connection with any computer related system or method. In the context of this document, a computer-readable medium may be an electronic, magnetic, optical, or other physical device or means that may contain or store a computer program for use by or in connection with a computer-related system or method. Configuration program 208 may be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In alternative embodiments where configuration program 208 is implemented in hardware, configuration program 208 may be implemented with any of the following technologies: a discrete logic circuit(s) having logic gates for implementing logic functions upon data signals, an application specific integrated circuit (ASIC) having appropriate combinatorial logic gates, a programmable gate array(s) (PGA), a field programmable gate array (FPGA), etc.

Figure 3:
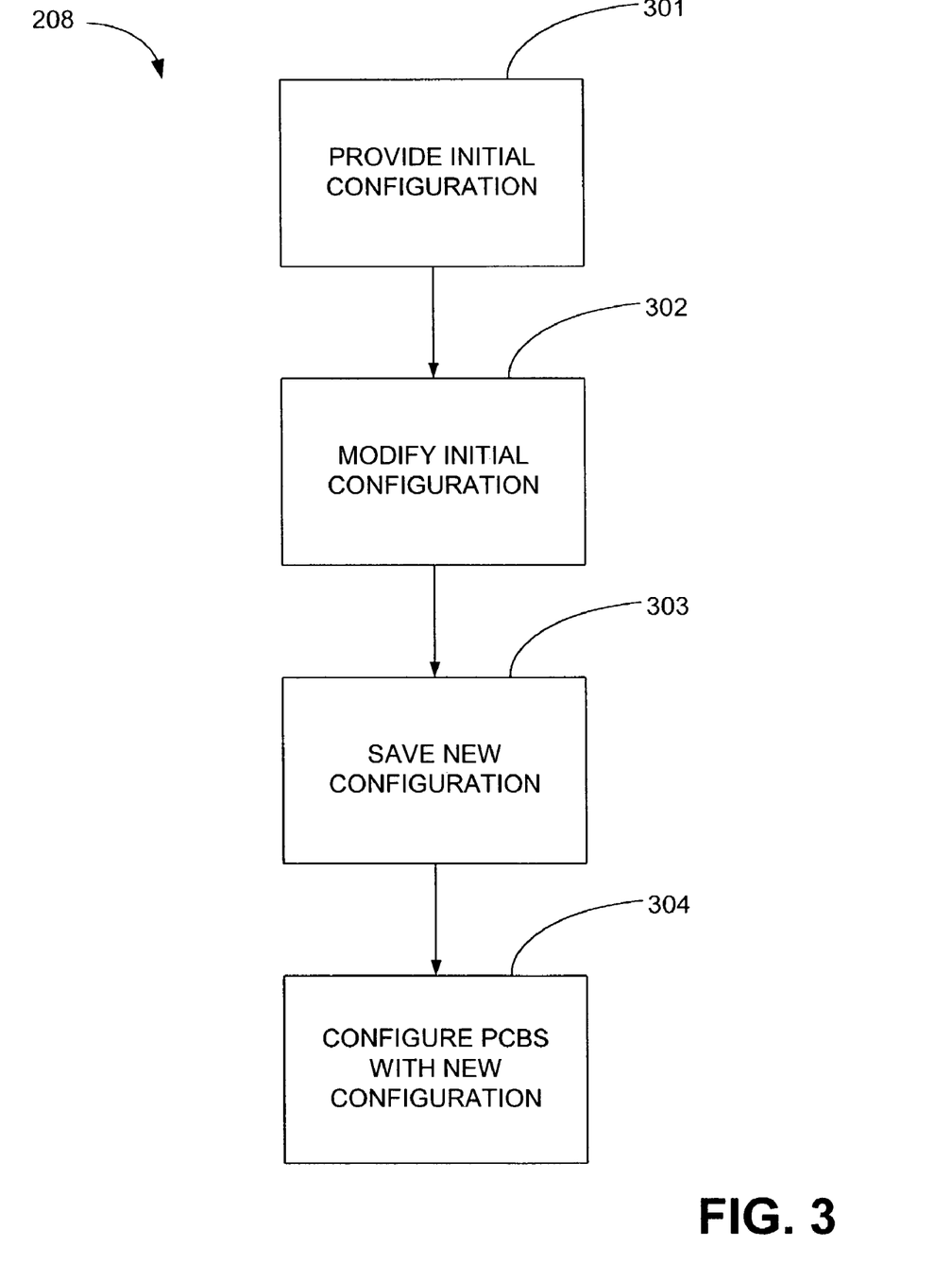
FIG. 3 is a flowchart of an embodiment of a method for configuring capabilities of printed circuit boards.

FIG. 3 is a flowchart of the method for configuring capabilities of a printed circuit board, as implemented by the configuration program 208. Each block may represent a module, segment, or portion of code, which comprises one or more executable instructions for implementing the specified logical function(s). It should also be noted that in some alternative implementations, the functions noted in the blocks may occur out of the order noted in the figure, or may include additional functions, without departing significantly from the functionality of the process. For example, two blocks shown in succession in the figure may in fact be executed substantially concurrently, the blocks may sometimes be executed in the reverse order, or some of the blocks may not be executed in all instances, depending upon the functionality involved. All such modifications and variations are intended to be included within the scope of this disclosure and to be protected by the accompanying claims.

As shown in FIG. 3, the process begins at step 301 where an initial configuration describing an initial set of capabilities is provided to the configuration program. This initial set corresponds to the capabilities of each board as currently configured.

The initial configuration may be provided in a number of ways. The boards may provide the initial configuration through a query made by the configuration program. A different program may make a configuration query and save the initial configuration to a file or database, which is provided to the configuration program. Alternatively, another mechanism that does not involve a query of the boards could be used, for example mapping identification information (e.g. model number, serial number, etc.) to a known configuration. Many other alternatives are well known in the art.

The process continues at step 302, where the initial configuration is modified by the configuration program to produce a new configuration describing a new set of capabilities. The new configuration corresponds to the capabilities the boards will have after the reconfiguration is complete. In this step, the operator is presented with the initial configuration, then interacts with configuration program to modify the capabilities of one or more boards. When the operator is satisfied with the capabilities as modified, the process continues at step 303.

At step 303, the modified configuration is saved by the configuration program as the new configuration. The new configuration may be saved permanently (to disk, database, EEPROM, etc.). Alternatively, the configuration program may save the new configuration temporarily, for use later by the same program.

Processing continues at step 304, where the plurality of boards is configured according to the new configuration. The same program may perform the configuration, but this is not required.

Figure 4:
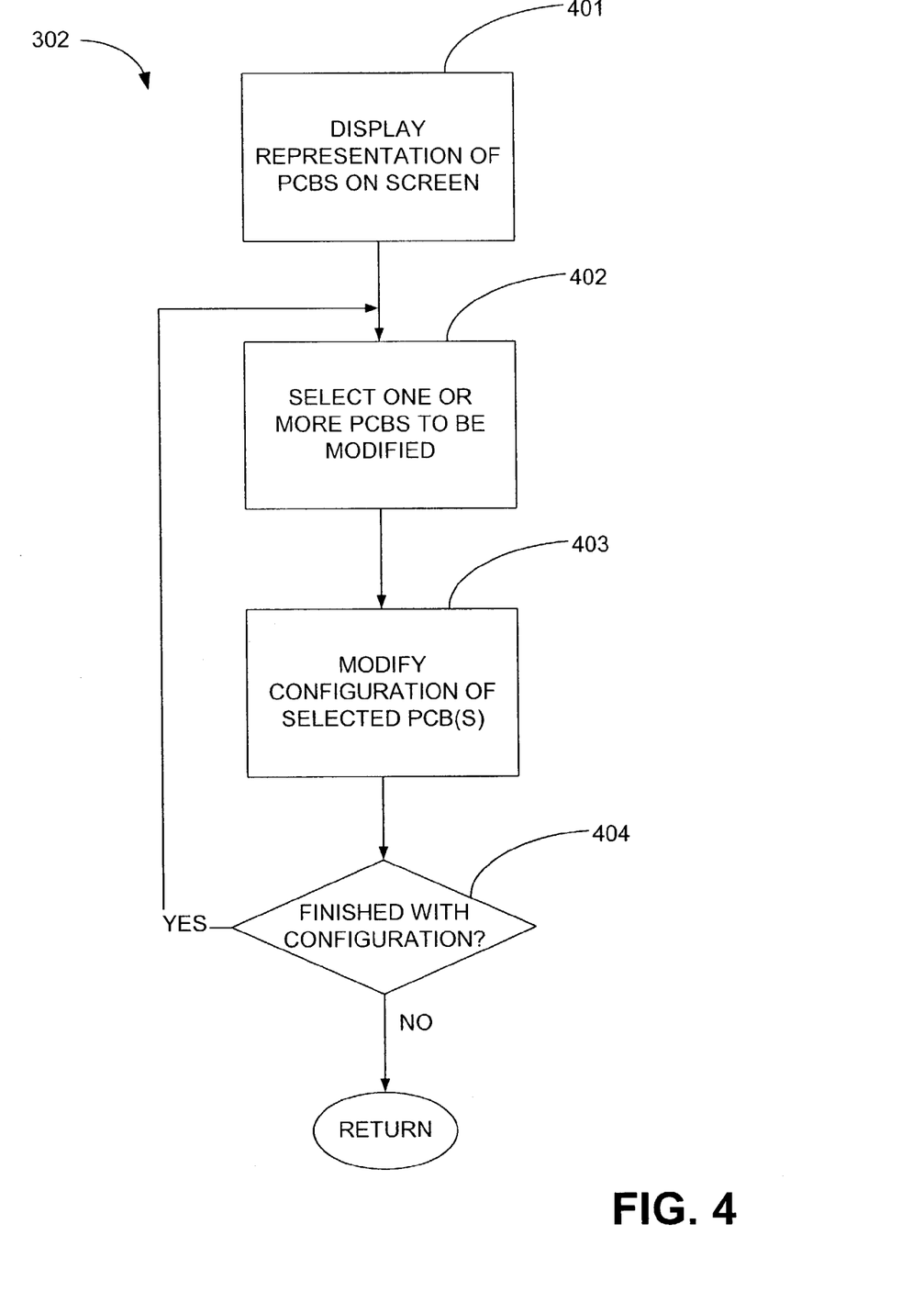
FIG. 4 is a flowchart of step 302 of FIG. 3.

FIG. 4 is a more detailed flowchart of step 302 of FIG. 3. At step 401, the configuration program displays a screen showing each board and the initial set of capabilities associated with each board. The arrangement of the boards on the screen corresponds generally to the physical layout of the boards as they are arranged in the cabinet.

Processing continues at step 402, where the user interacts with the configuration program to select one or more boards on the screen in order to modify the capabilities of the corresponding board 102. Next, at step 403, the user modifies at least one capability of the selected board(s) from the initial value as shown.

At the next step 404, the user may decide to select another board on the screen for modification. If the decision is YES (select another), then processing branches to step 402, and steps 402 (selection) and 403 (modification) are repeated. If the decision is NO (do not select another), then processing returns to step 303 in FIG. 3.

Figure 5:
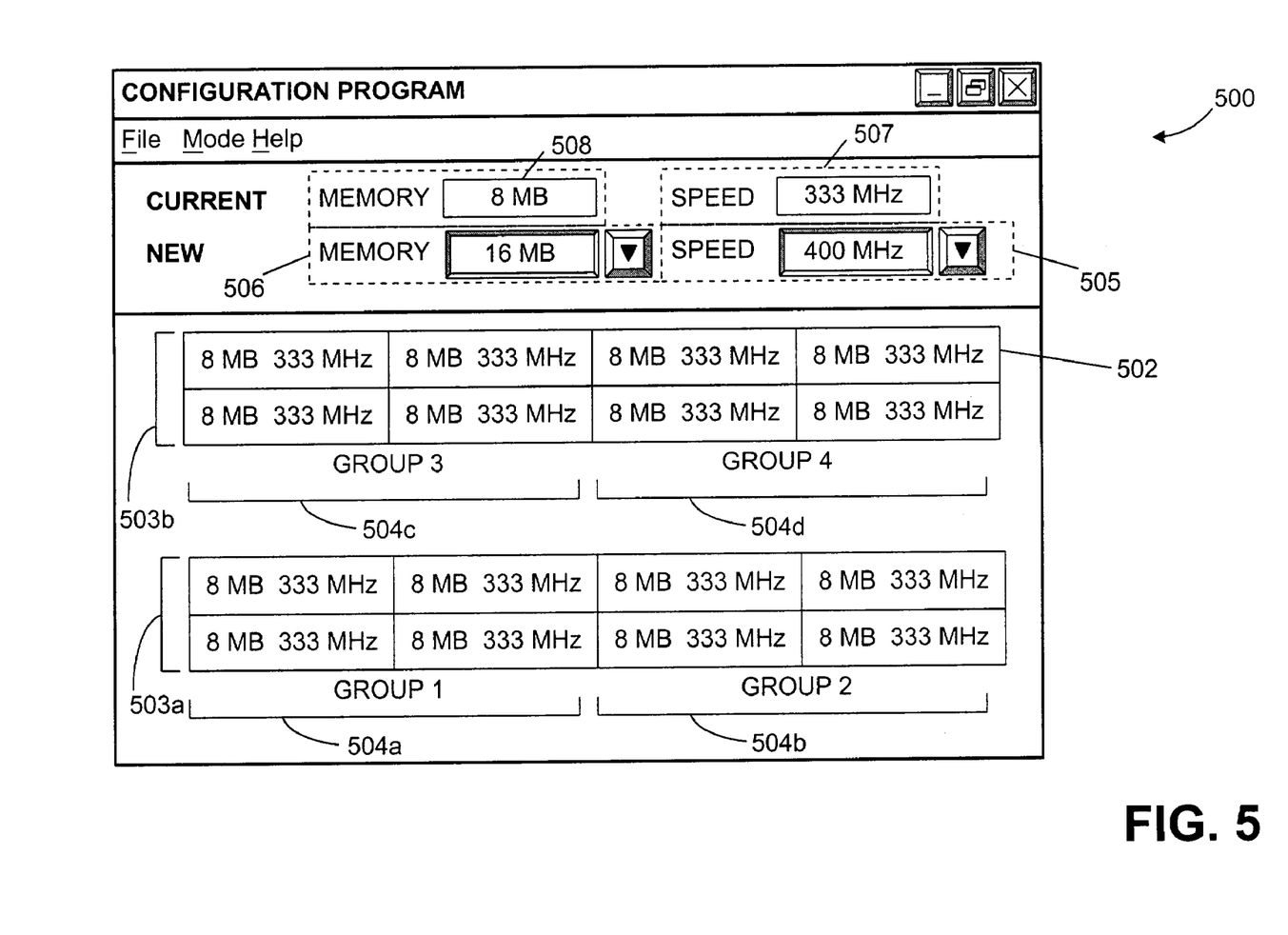
FIGS. 5-7 are screen shots of a representative user interface for an embodiment of a method for configuring capabilities of printed circuit boards.
Figure 6:
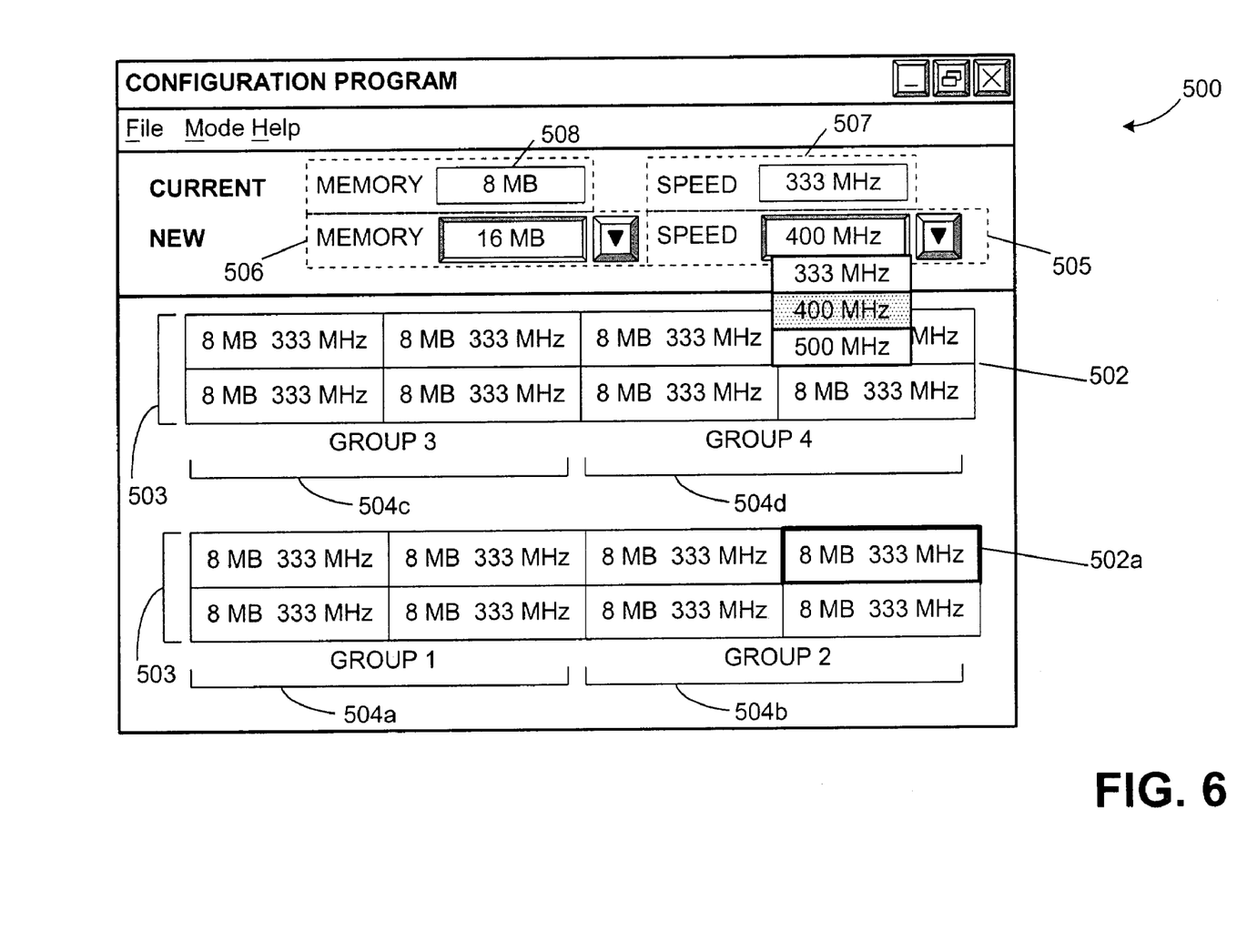
Figure 7:
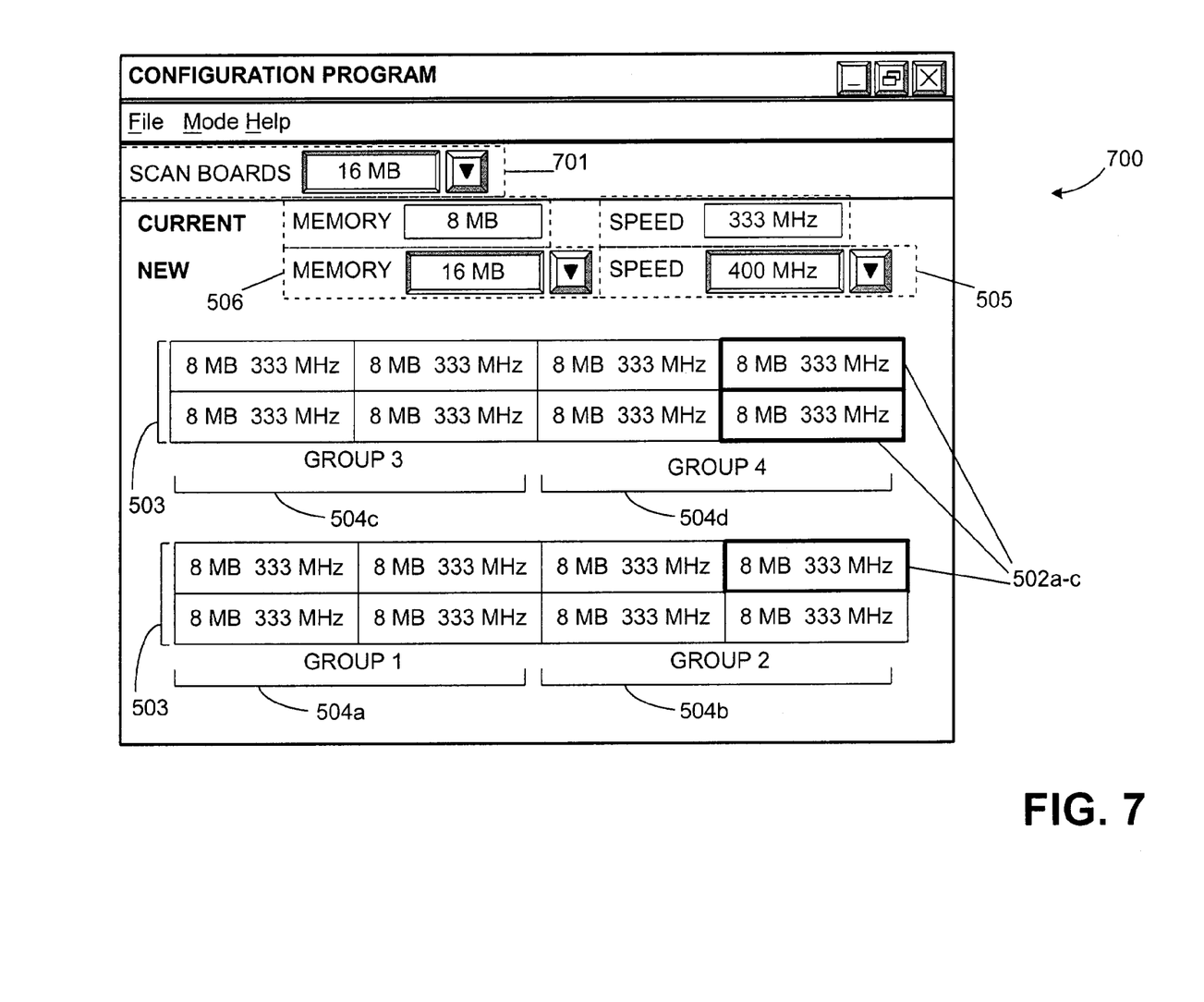

FIGS. 5-7 are screen shots of a representative user interface 500 for an embodiment of configuration program 208. In FIG. 5, the user is presented with a screen with boxes 502 representing each board 102, and each box 502 displays the initial set of capabilities associated with that board. In this example, each board 102 has two capabilities, clock speed and memory, shown side by side in box 502. Although boxes containing text are used in this example, symbols, bitmaps and other graphics could be used to represent a board and its capabilities.

The boxes 502 on the screen are arranged into rows and/or groups that correspond to the physical layout of boards in a cabinet. Thus, the screen in FIG. 5 shows boxes 502 arranged into two rows 503a-b and four groups 504a-d, corresponding to the rows 104 and groups 105a-d in FIG. 1. Boxes 502 are also numbered/labeled in a way that corresponds to the numbering/labeling of the physical layout.

The configuration program 208 allows the user to modify the capabilities of selected boards. In this example, the screen contains a drop-down list box for each capability, one list box 505 for modifying clock speed and another list box 506 for modifying memory. In some embodiments, the controls limit the user's choices to specific values, to prevent input errors. Although drop-down list boxes are shown here, many alternatives to accomplish this can be used. Another embodiment presents a separate dialog box after selection, instead of putting the controls on the main screen.

In some embodiments, the screen also contains a set of controls 507, 508 which contain the current value for each capability. Thus, while boxes 502 contain initial values, controls 507, 508 contain the value as last modified. In addition, text color may be used to indicate that the current choice is either equal to or different from the current capability.

In FIG. 6, the user has selected one box 502a in order to modify the capabilities of the associated board 102, and the selected box 502a is indicated by surrounding it with a dark border. However, other indications could be used, such as changing color, etc. The user next interacts with the capabilities controls 505 and list box 506 to change the clock speed and memory of the selected board to the desired setting. In this example, the user chooses a value of 400 MHz for the clock speed capability, from a list of four choices.

FIG. 7 shows another embodiment that allows the selection of multiple boxes 502a-c. The boxes selected are not required to be located next to each other. As before, the user interface may indicate which boxes 502a-c are selected by, for example, changing color, surrounding with a border, etc. When multiple boxes 502a-c are selected, and then the user interacts with capabilities controls 505 and list box 506, the values chosen for clock speed and memory are applied to all selected boxes 502a-c.

The embodiment of FIG. 7 also allows the modification of one or more system-wide capabilities. A system-wide capability is one that applies to the system as a whole rather than to an individual board, but is linked to a board-level capability. In this example, the system-wide capability is the number of boards which are to be dedicated to a scan function. This capability is linked to a board level capability in that the value chosen for the number of scan boards affects the choices allowed for the clock speed and memory for each board. This capability is modified through control 701. In some embodiments, the control 701 is a list box, and the largest value is related to the total number of boards 102, which reduces user input errors.

Figure 8:
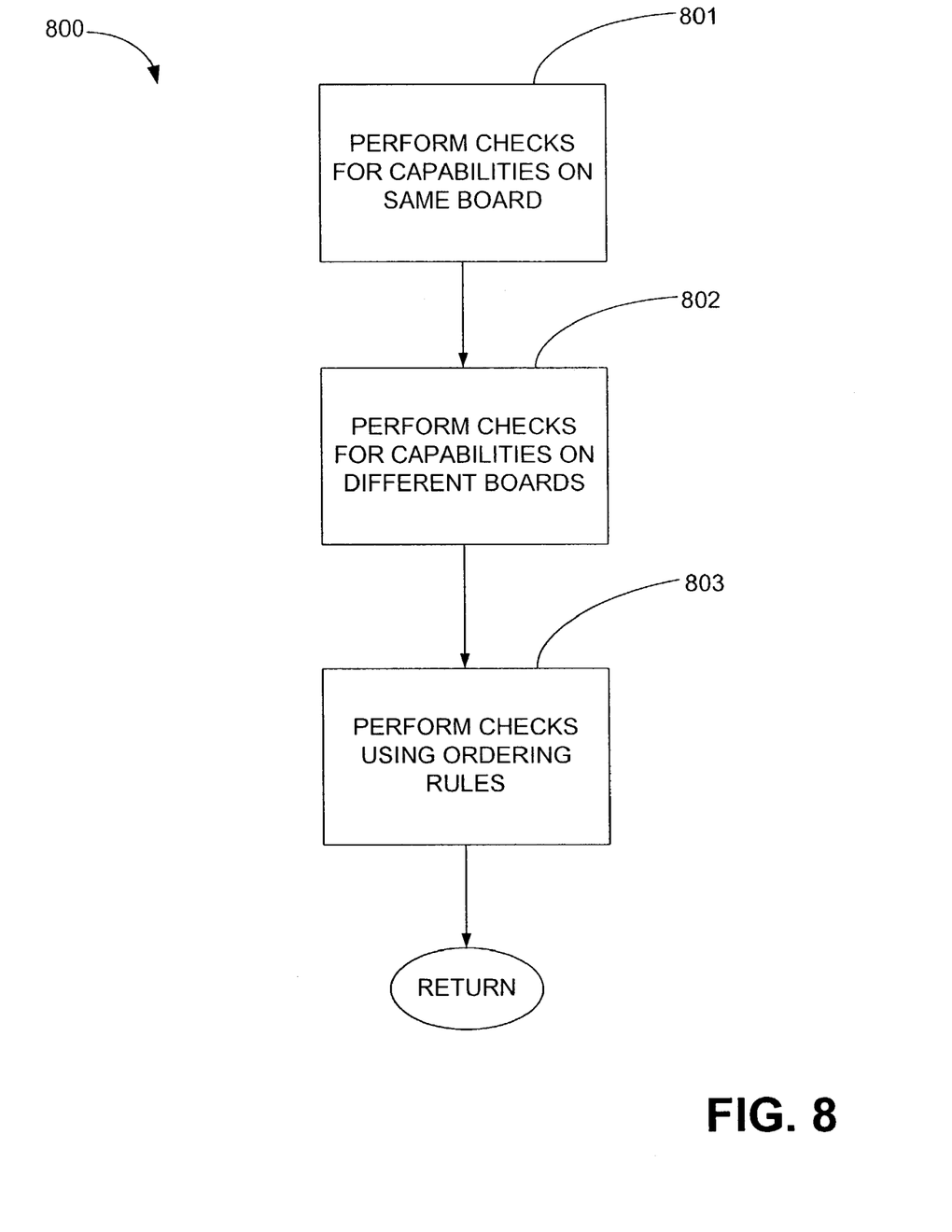
FIG. 8 is a flowchart showing another aspect (rules checking) of an embodiment of a method for configuring capabilities of printed circuit boards.

FIG. 8 is a flowchart illustrating yet another aspect that may be provided by embodiments of the configuration program 208, that is, checking the configuration against a set of validation rules. The user interface itself imposes a certain level of validation, through the use of list boxes, check boxes and other controls that give the user a limited set of choices for a given capability (as compared to a type-in edit field). These rules impose an additional degree of error checking.

Also, performing the check during the save, after all capabilities have been modified to the user's satisfaction, allows rules which check the interaction of various capabilities with each other. Several examples will be given, but the embodiments are not so limited.

One type of rule, called a board-granular rule, allows checking across capabilities on the same board 102. For example, a value of Full for the capability Duplex may not be allowed when value 10 Mb/s chosen for Line Speed, where Duplex and Line Speed are capabilities on the same board 102.

Another rule type, called a system-granular rule, allows checking across capabilities on the different boards 102. One example of a system-granular rule is an exclusivity rule, where one value is mutually exclusive of another. For example, if one board has the value A-law for the capability Codec, then no other board in the same group is allowed to have the value A-law for the capability Codec. Another example of a system-granular rule is a minimum/maximum rule, where one value determines the allowable values for another capability. For example, if one board has Clock Speed set to 600 MHz, then the Clock Speed for all other boards must be set to at least 200 MHz.

A different type of rule, called an ordering rule, also applies across boards 102. The ordering rule will be explained with reference back to FIG. 1. This rule type assures that the capabilities of all boards, or a group of boards, follow a certain order. For example, suppose some boards have a memory capability. An ordering rule may assure that the boards in Group 105a have lower values for memory than the boards in Group 105b. In another variation of the ordering rule, the boards in Group 105c must have increasing values for memory.

In some embodiments, the user can choose which validation rules are used during rule checking. In one embodiment, the user can choose between two modes, Standard and Expert. In Standard mode, all rules are used during the checking process. In Expert mode, only "hard" rules are checked, but "soft" rules are not. The system using the boards 102 will not function properly when a hard rule is violated. In contrast, the system will function properly when a soft rule is violated; though it may not perform optimally. In another embodiment, multiple modes are supported, each corresponding to a specific set of rules to be applied and to the strictness with which the rules are applied.

In some embodiments, rules checking is implemented by step 303 of FIG. 3, where the modified configuration is saved as the new configuration. In other embodiments, only "hard" rules checking is performed after the user makes each modification to a capability, and both "hard" and "soft" rules checking is performed when the modified configuration is saved.

Returning back to the flowchart of FIG. 8, which illustrates the functionality of an embodiment that uses rule checking, the process begins at step 801. At step 801, checking is performed for those rules that check capabilities on the same board. Next, at step 802, checking is performed for those rules which check capabilities across multiple boards. Finally, at step 803, checking is performed for any ordering rules.

In the example embodiments discussed so far, the layout of boxes 502 (representing boards 102) on the screen corresponds to the physical arrangement of boards 102 in a cabinet 101. This embodiment is most useful when the operator doing the upgrade or reconfiguration is familiar with the layout of boards 102 in the cabinet 101, perhaps through frequent access to the boards in the cabinet, or perhaps because the documentation for the system refers to the physical arrangement. However, there are other environments where the operator is not familiar with the arrangement of boards 102 in the cabinet 101. Instead, the operator is familiar with a different arrangement of boards, a "logical" arrangement.

Figure 9:
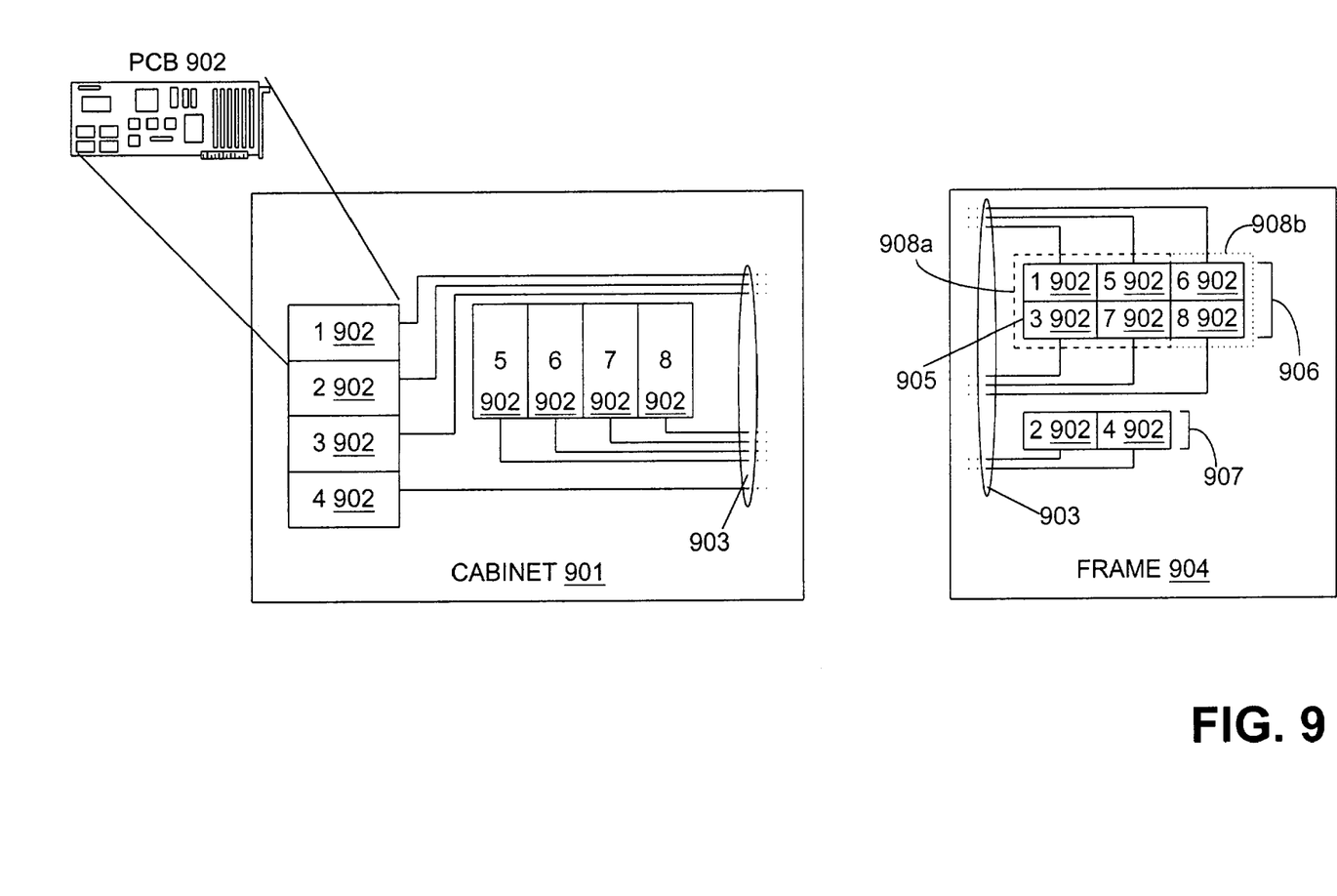
FIG. 9 is a diagram of the environment of an electronic system, showing both physical and logical arrangements of printed circuit boards, in which another embodiment of a system for configuring the capabilities of printed circuit boards can be used.

One such logical arrangement is shown in FIG. 9. Boards 902 in the cabinet 901 are connected, via cables 903 or other links, to a mounting structure, sometimes called a distribution frame 904. Each board 902 is said to have an "appearance" 905 on the distribution frame 904. In this scenario, the operator is more familiar with arrangement of appearances 905 on distribution frame 904 than he is with arrangement of the boards 902 in the cabinet 901.

In cabinet 901, the boards numbered 1-4 are arranged in a vertical stack on the left, while boards numbered 5-8 are arranged in a horizontal row on the right. However, the appearances 905 on distribution frame 904 corresponding to those boards 902 are arranged differently: one row 906 of three stacks, each stack containing two boards; and another row 907 of two boards. Furthermore, the appearances 905 are logically grouped into groups 908a-b, although no such grouping occurs with boards 902 in cabinet 901.

Figure 10:
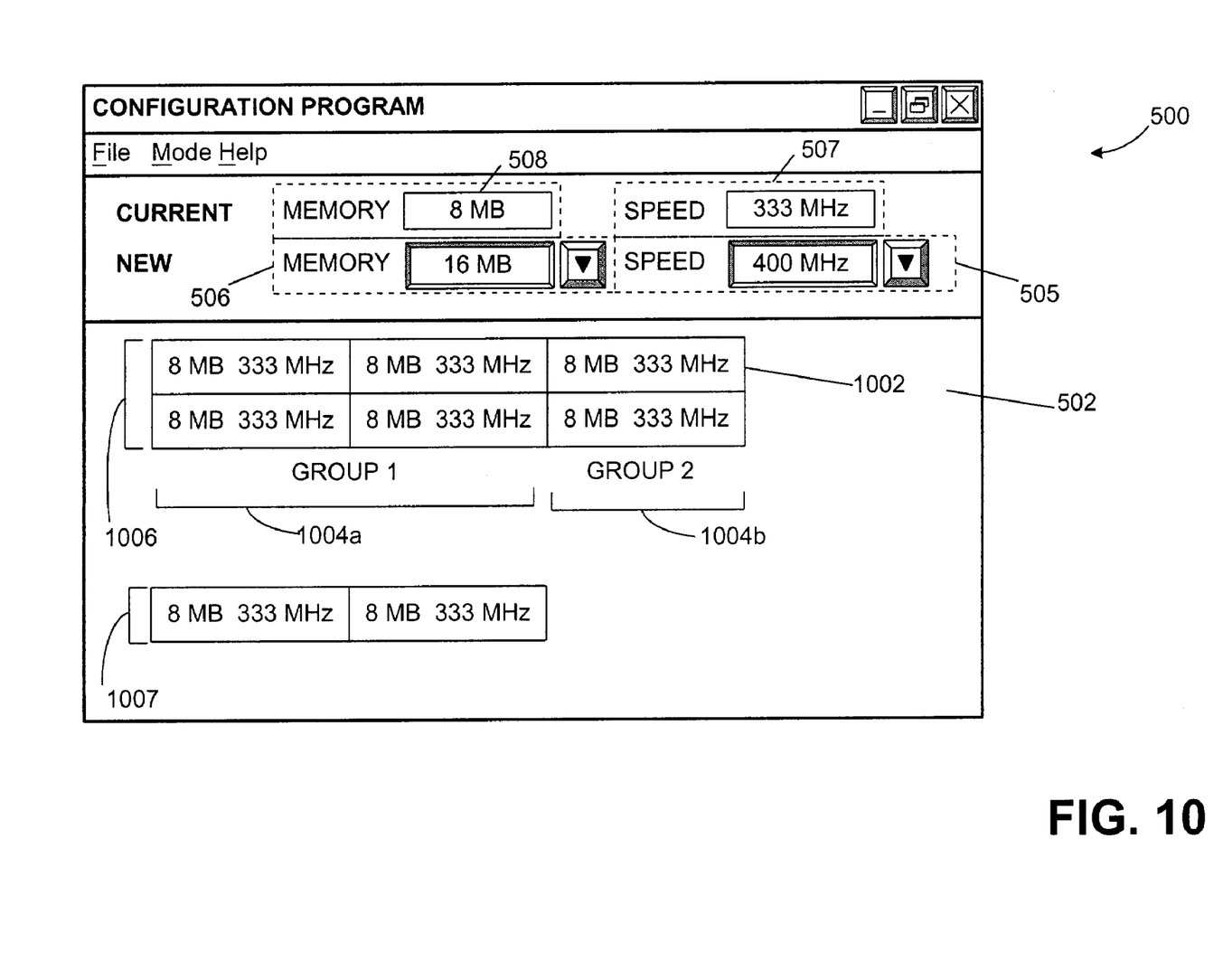
FIG. 10 is a screen shot of a representative user interface for the embodiment shown in FIG. 9, of a method for configuring capabilities of printed circuit boards.

When an operator is familiar with a logical arrangement such as shown in FIG. 10, one embodiment of configuration program 208 displays a screen this is organized using this logical arrangement. FIG. 10 is a screen shot of a representative user interface of such an embodiment, corresponding to the boards 902, cabinet 901, appearances 905 and distribution frame 904 as shown in FIG. 9. Boxes 1002 are arranged into two rows 1006 and 1007 corresponding to the rows 906 and 907 in FIG. 9. Boxes 1002 are arranged into two groups 1004a-b. Finally, boxes 1002 are also numbered/labeled in a way that corresponds to the numbering/labeling of the physical layout. Functionally, the user interface of FIG. 10 works as described before. That is, the user interacts with this user interface in the same manner as described with reference to FIGS. 5-7.

The foregoing description has been presented for purposes of illustration and description. It is not intended to be exhaustive. Obvious modifications or variations are possible in light of the above teachings. The embodiments discussed, however, were chosen and described to enable one of ordinary skill in the art to utilize the invention in various embodiments and with various modifications as are suited to the particular use contemplated. All such modifications and variations are within the scope of the disclosure as determined by the claims, when interpreted in accordance with the breadth to which they are fairly and legally entitled.

The invention claimed is:

1. A method for configuring a plurality of printed circuit boards (PCBs) mounted in a cabinet, wherein each PCB has a corresponding set of capabilities, the method comprising:
    providing an initial configuration describing a first set of capabilities corresponding to each PCB as currently configured;
    modifying the initial configuration through a user interface to produce a new configuration describing a second set of capabilities corresponding to each PCB after configuring is complete;
    saving the initial configuration as modified by the user interface to be the new configuration; and
    configuring the plurality of PCBs according to the new configuration,
    wherein modifying the initial configuration further comprises:
    displaying on screen a representation of each PCB, arranged in a first arrangement, such that the first arrangement corresponds generally to a second arrangement of the plurality of PCBs;
    selecting at least one PCB to be modified; and
    modifying at least one capability in the first set of capabilities for the at least one selected PCB.

2. The method of claim 1, wherein the second arrangement is the arrangement of the plurality of PCBs in the cabinet.

3. The method of claim 1, wherein each of the plurality of PCBs is electrically connected to an appearance in a distribution frame, and
    wherein the second arrangement is the arrangement of the appearances in the distribution frame.

4. The method of claim 1, wherein at least one of the PCBs contains a firmware module, and wherein configuring the plurality of new PCBs comprises upgrading the firmware module.

5. The method of claim 1, wherein saving the initial configuration further comprises validating the new configuration according to at least one rule.

6. The method of claim 5, wherein the rule applies across capabilities on the same PCB.

7. The method of claim 5, wherein the rule applies across capabilities on different PCBs.

8. The method of claim 5, wherein the rule is an ordering rule.

9. The method of claim 1, wherein modifying at least one capability further comprises choosing a value from a limited set of values.

10. A system comprising:
    a plurality of printed circuit boards (PCBs) mounted in a cabinet, wherein each PCB has a corresponding set of capabilities; and
    a configuration console comprising:
        a memory to store one or more programs, where programs comprise executable instructions;
        a processor in communication with the memory through a local interface for executing instructions from the one or more programs stored in memory;
        a display in communication with the processor through the local interface, used by the one or more programs as an output device;
        an input device in communication with the processor through the local interface, used by the one or more programs to obtain user input;
        logic configured to provide an initial configuration describing a first set of capabilities corresponding to each PCB as currently configured;
        logic configured to modify the initial configuration through a user interface to produce a new configuration describing a second set of capabilities corresponding to each PCB after configuring is complete;
        logic configured to save the initial configuration as modified by the user interface to be the new configuration; and
        logic configured to configure the plurality of PCBs according to the new configuration,
        wherein the logic to configure to modify further comprises:
            logic configured to display on screen a representation of each PCB, arranged in a first arrangement, such that the first arrangement of representations corresponds generally to a second arrangement of the plurality of PCBs;

logic configured to select at least one PCB to be modified; and logic configured to modify at least one capability in the first set of capabilities for the at least one selected PCB.

11. The system of claim 10, wherein the second arrangement is the arrangement of the plurality of PCBs in the cabinet.

12. The system of claim 10, wherein each of the plurality of PCBs is electrically connected to an appearance in a distribution frame, and wherein the second arrangement is the arrangement of the appearances in the distribution frame.

13. The system of claim 10, wherein at least one of the PCBs contains a firmware module, and wherein configuring the plurality of new PCBs comprises upgrading the firmware module.

14. The system of claim 10, wherein the logic to save the initial configuration further comprises logic to validate the new configuration according to at least one rule.

15. The system of claim 14, wherein the rule applies across capabilities on the same PCB.

16. The system of claim 14, wherein the rule applies across capabilities on different PCBs.

17. The system of claim 14, wherein the rule is an ordering rule.

18. The system of claim 10, wherein the logic to modify at least one capability further comprises logic to choose a value from a limited set of values.

19. A computer readable storage medium containing program code for controlling a method for configuring a plurality of printed circuit boards (PCBs) mounted in a cabinet, wherein each PCB has a corresponding set of capabilities, comprising logic to perform the steps of:

providing an initial configuration describing a first set of capabilities corresponding to each PCB as currently configured;

modifying the initial configuration through a user interface to produce a new configuration describing a second set of capabilities corresponding to each PCB after configuring is complete;

saving the initial configuration as modified by the user interface to be the new configuration; and configuring the plurality of PCBs according to the new configuration, wherein modifying the initial configuration further comprises:

displaying on screen a representation of each PCB, arranged in a first arrangement, such that the first arrangement of representations corresponds generally to a second arrangement of the plurality of PCBs;

selecting at least one PCB to be modified; and modifying at least one capability in the first set of capabilities for the at least one selected PCB.

* * * * *